(12) United States Patent
Dietze et al.

(10) Patent No.: US 10,942,207 B2
(45) Date of Patent: Mar. 9, 2021

(54) SYSTEM FOR EVALUATING BATTERY CONNECTION QUALITY

(71) Applicant: GM GLOBAL TECHNOLOGY OPERATIONS LLC, Detroit, MI (US)

(72) Inventors: Robert H. Dietze, Brighton, MI (US); Jason A. Lupienski, Birmingham, MI (US); Robert W. Chalfant, Berkley, MI (US)

(73) Assignee: GM Global Technology Operations LLC, Detroit, MI (US)

(*) Notice: Subject to any disclaimer, the term of this patent is extended or adjusted under 35 U.S.C. 154(b) by 192 days.

(21) Appl. No.: 15/290,641

(22) Filed: Oct. 11, 2016

(65) Prior Publication Data

US 2017/0285090 A1 Oct. 5, 2017

Related U.S. Application Data

(60) Provisional application No. 62/317,868, filed on Apr. 4, 2016.

(51) Int. Cl.
*G01R 31/04* (2006.01)
*G01R 31/36* (2020.01)

(52) U.S. Cl.
CPC ....... *G01R 31/041* (2013.01); *G01R 31/3658* (2013.01)

(58) Field of Classification Search
USPC ................................................. 324/426–437
See application file for complete search history.

(56) References Cited

U.S. PATENT DOCUMENTS

| 5,903,154 A * | 5/1999 | Zhang | G01R 31/3696 324/437 |
| 2016/0069965 A1* | 3/2016 | Lupienski | G01R 31/3696 324/426 |

FOREIGN PATENT DOCUMENTS

| DE | 102013016791 A1 | 7/2014 |
| DE | 102014003910 A1 | 9/2015 |
| DE | 102015114455 A1 | 3/2016 |

* cited by examiner

*Primary Examiner* — Vincent Q Nguyen
(74) *Attorney, Agent, or Firm* — Quinn IP Law

(57) ABSTRACT

A system for evaluating battery connection quality in one or more battery modules of a battery assembly includes a battery testing unit having a housing including an upper surface and a lower surface. A plurality of testing modules are disposed on the lower surface of the housing to communicate with and electrically contact the one or more battery modules of the battery assembly. The plurality of testing modules each include at least one connector extending from a lower surface of the testing module and at least one contact disposed on one or more side surfaces of the testing module. A controller is in electrical communication with the at least one connector and at least one contacts to simultaneously evaluate voltage and resistance measurements of the one or more battery modules of the battery assembly.

20 Claims, 8 Drawing Sheets

SYSTEM FOR EVALUATING BATTERY CONNECTION QUALITY

CROSS REFERENCE TO RELATED APPLICATIONS

This application claims the benefit of U.S. Provisional Patent Application No. 62/317,868, entitled "SYSTEM FOR EVALUATING BATTERY CONNECTION QUALITY" filed on Apr. 4, 2016, which is incorporated by reference in its entirety in this disclosure.

INTRODUCTION

This disclosure relates to a system for evaluating battery connection quality in a battery assembly.

Vehicles, including hybrid and hybrid-electric vehicles, include batteries for storage of electrical energy. The rechargeable battery or batteries may provide power used for vehicle traction. Furthermore, the batteries may be used to provide power for operation of accessories and for starting, lighting, and ignition functions of the vehicle.

A vehicle battery assembly may include a number of individual constituent battery cells arranged in a variety of suitable configurations. In certain configurations, the individual battery cells may be electrically connected via one or more welded tabs. It is important that welded tab electrical connections are properly formed during manufacture and assembly of the battery assembly, thereby ensuring expected battery performance. Battery cell tab connection testing may utilize visual, physical, and other mechanical testing or inspection methods to determine tab connection quality.

SUMMARY

A system for evaluating battery connection quality in one or more battery modules of a battery assembly includes a battery testing unit having a housing including an upper surface and a lower surface. A plurality of testing modules are disposed on the lower surface of the housing to communicate with and electrically contact the one or more battery modules. The plurality of testing modules each include a body having a lower surface receiving and supporting at least one element and one or more side surfaces extending from the lower surface to receive and support at least one contact.

At least one external connector cooperates with the battery testing unit housing and is in electrical communication with the at least one element and at least one contact of each of the plurality of testing modules. A controller is in electrical communication with the at least one external connector to perform one or more determinations of electrical connection quality of the one or more battery modules. The controller is in communication with the at least one element and at least one contact to simultaneously evaluate voltage and resistance measurements of the one or more battery modules.

An interface is at least partially received within the battery testing housing and is in electrical communication with the at least one element and the at least one contact. The battery testing housing further includes one or more apertures extending through and between the upper and lower surfaces of the battery testing housing sized to at least partially receive the at least one external connector. The interface may be in communication with the at least one external connector when the at least one external connector is at least partially received within the battery testing housing.

The at least one element further includes at least one spring loaded pin extending from the lower surface of the body of each of the plurality of testing modules to releasably engage and electrically connect the battery testing unit with an interconnecting board of the one or more battery modules. At least one channel is formed between opposing side surfaces of opposing bodies of the plurality of testing modules and sized to receive the at least one contact to releasably engage and electrically connect a tab and the interconnecting member of the one or more battery modules. The at least one element extends from the lower surface of the body of each of the plurality of testing modules to releasably engage a fastener interconnecting a battery cell sense line in the at least one channel and a trace line of the interconnecting board. The controller further includes one or more voltmeters and one or more current sources configured to be used in connection with determining electrical connection quality of the one or more battery modules.

In another embodiment of the disclosure, a testing unit for evaluating battery connection quality in one or more battery modules of a battery assembly includes a housing including an upper surface, a lower surface and one or more apertures extending through the housing between the upper and lower surfaces. A plurality of testing modules are disposed on the lower surface of the housing to communicate with and electrically contact the one or more battery modules. Each of the plurality of testing modules includes a body having a lower surface receiving and supporting at least one element and one or more side surfaces extending from the lower surface to receive and support at least one contact.

An interface is at least partially received within the battery testing housing and is in electrical communication with the at least one element and the at least one contact. At least one external connector cooperates with the battery testing unit housing and is in electrical communication with the interface when the at least one external connector is at least partially received within the battery testing housing. The at least one external connector performs one or more determinations of electrical connection quality through the at least one element and at least one contact to simultaneously evaluate voltage and resistance measurements of the one or more battery modules.

The at least one element further includes at least one spring loaded pin extending from the lower surface of the body of each of the plurality of testing modules to releasably engage and electrically connect the battery testing unit with an interconnecting board of the one or more battery modules. At least one channel is formed between opposing side surfaces of opposing bodies of the plurality of testing modules and sized to receive the at least one contact to releasably engage and electrically connect a tab and the interconnecting member of the one or more battery modules. The at least one element extends from the lower surface of the body of each of the plurality of testing modules to releasably engage a fastener interconnecting a battery cell sense line in the at least one channel and a trace line of the interconnecting board.

The above features and advantages, and other features and advantages, of the present disclosure are readily apparent from the following detailed description of some of the best modes and other embodiments for carrying out the disclosure, as defined in the appended claims, when taken in connection with the accompanying drawings.

DETAILED DESCRIPTION

Figure 1:
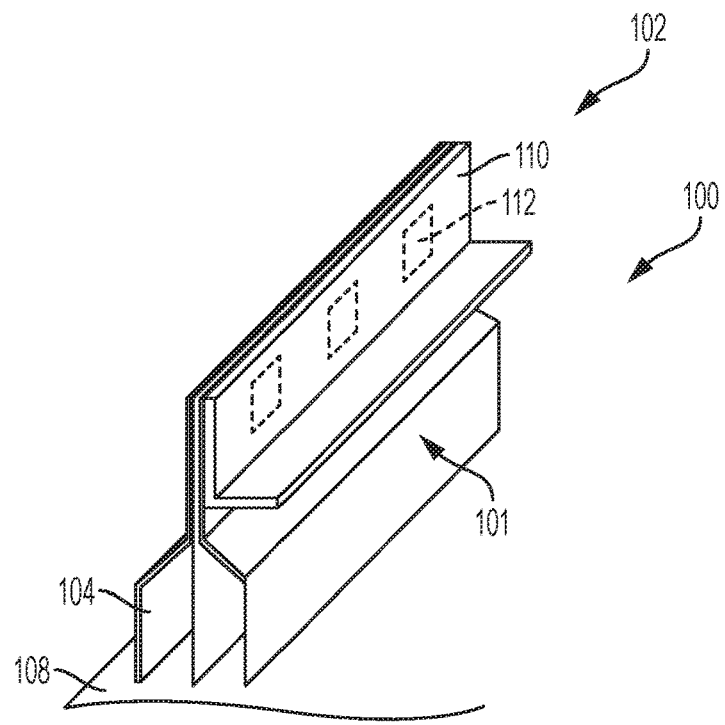
FIG. 1 is a schematic perspective view of a portion of a battery module for a battery assembly for use in accordance with the embodiments of the disclosure.

Reference will now be made in detail to several embodiments of the disclosure that are illustrated in accompanying drawings. Whenever possible, the same or similar reference numerals are used in the drawings and the description to refer to the same or like parts or steps. The drawings are in simplified form and are not to precise scale. For purposes of convenience and clarity, directional terms such as top, bottom, left, right, up, over, above, below, beneath, rear, and front, may be used with respect to the drawings. These and similar directional terms are not to be construed to limit the scope of the disclosure.

The components of the disclosed embodiments, as generally described and illustrated in the Figures herein, could be arranged and designed in a wide variety of different configurations. Thus, the following detailed description of the embodiments of the disclosure is not intended to limit the scope of the disclosure, as claimed, but is merely representative of possible embodiments of the disclosure.

In addition, while numerous specific details are set forth in the following description in order to provide a thorough understanding of the embodiments disclosed herein, some embodiments may be practiced without some or all of these details. Moreover, for the purpose of clarity, certain technical material in the related art has not been described in detail in order to avoid unnecessarily obscuring the disclosure.

Referring to the drawings, wherein like reference numbers correspond to like or similar components throughout the several Figures, FIG. 1, consistent with embodiments disclosed herein, illustrates a portion of a battery module 101 of a battery assembly 100, such as a battery assembly included in a motor vehicle (not shown). The vehicle may include, but not be limited to, a commercial vehicle, industrial vehicle, passenger vehicle, aircraft, watercraft, train or the like. It is also contemplated that the vehicle may be a mobile platform, such as an airplane, all-terrain vehicle (ATV), boat, personal movement apparatus, robot and the like to accomplish the purposes of this disclosure.

The battery assembly 100 may include a plurality of individual constituent battery cells. The battery assembly 100 or constituent cells may be configured to provide an amount of electric power sufficient to operate a variety of systems associated with a vehicle including, for example, vehicle drivetrain systems. The battery cells may utilize battery technology that may include, for example, lead-acid, nickel-metal hydride (NiMH), lithium-ion (Li-Ion), Li-Ion polymer, lithium-air, nickel-cadmium (NiCad), valve-regulated lead-acid (VRLA) including absorbed glass mat (AGM), nickel-zinc (NiZn), molten salt (ZEBRA battery), nickel manganese cobalt (NMC), lithium iron phosphate (LFP), lithium manganese oxide (LMO), as well as other suitable battery technologies and/or combinations thereof.

Individual battery cells may be electrically connected to form a battery cell group. In certain embodiments, a plurality of battery cell groups may be incorporated in a battery module 101. A plurality of battery modules 101 may be similarly included in one or more battery units of a battery assembly 100. In certain embodiments, individual battery cells included in a battery assembly 100 may include prismatic pouch battery cells. Individual battery cells may be arranged in a stack configuration, and may include tabs 104 forming battery cell terminals that may be suitably electrically connected for provision of electrical power to loads and/or for charging and/or discharging of the battery cells.

In some embodiments, a plurality of individual battery cells may be electrically connected in parallel via associated tabs to form a battery cell group. A plurality of battery cell groups may be electrically connected in series via one or more common buses or interconnecting members 102, such as L-shaped channels, to form a battery module included in a battery pack.

FIG. 1 shows a perspective view of a non-limiting example of a portion of a multi-cell battery assembly 100 for a vehicle (not shown) having an elongated L-shaped interconnecting member 102. A battery module 101 may include an extended series of interconnecting members 102 arranged side-by-side in multiple rows.

Each interconnecting member 102 joins oppositely-charged battery cell tabs 104 of adjacent battery cells, with the battery cell tabs 104 forming individual electrode extensions of a given battery cell. Each battery cell tab 104 may be internally-welded below an interconnecting board 108 to the various anodes or cathodes of that particular battery cell, as is well understood by those of ordinary skill in the art. The battery cell tabs 104 may be welded to a longitudinal side wall 110 of a given interconnecting member 102, with substantially identical welds 112 formed at each interconnecting member 102.

Figure 2:
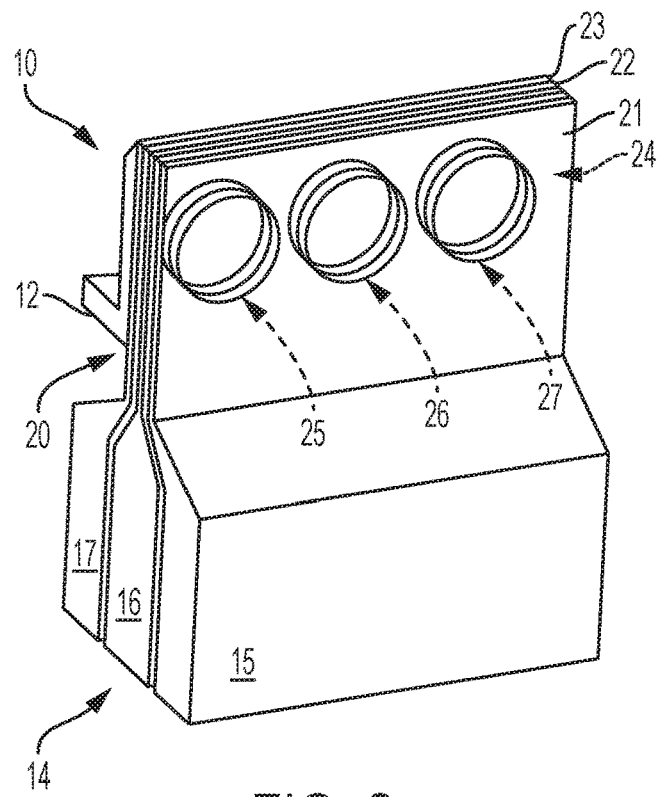
FIG. 2 is a schematic isometric view of a portion of a multi-cell battery of the battery assembly in accordance with the disclosure.

Referring now to FIG. 2, an isometric view of a portion of a multi-cell battery module 10 of the battery assembly is shown that is consistent with embodiments disclosed herein. In certain embodiments, the multi-cell battery module 10 may be included in a battery assembly configured to power systems associated with a vehicle (not shown). The battery module 10 includes a plurality of joints between components. Each of the joints includes a plurality of first members or first sides, such as at least one interconnecting member 12 and a plurality of second members or second sides, such as battery cells 14. The first and second members are on opposing sides of the joint, and designation as first or second is not limiting. The battery cells 14 may be individually denoted as a first cell 15, a second cell 16, and a third cell 17. However, it is understood that the battery cells 14 may be assembled with a first cell 15 and a second cell 16. The two battery cell and three battery cell configurations will be collectively described. Features and components shown in other figures may be incorporated and used with those shown in FIG. 1.

The interconnecting member 12 shown may be referred to as a common bus or an L-shaped channel bus. The battery module 10, or portions thereof, may alternatively be referred to as a battery pack. Furthermore, each of the first through third cells 15, 16, 17 may be configured to operate as individual batteries, which are then combined and arranged to provide specific characteristics for the battery module 10, as required by the specific hybrid or hybrid-electric vehicles into which the battery module 10 may be incorporated. The battery cells 15, 16, 17 may utilize battery technology and/or chemistries as described above individually or in combination.

As described herein, the attachments for the interconnecting member 12 are shown, and the interconnecting member 12 may be in communication with fewer or more battery cells 14 than shown. The exact configurations of the portion of the battery module 10 shown in the Figures are illustrative and do not limit the scope of the disclosure. The interconnecting member 12 may be common to one or more battery cells 14 and may be formed of a non-conductive material. It is understood that the interconnecting member 12 may also include electrically conductive material including, without limitation, copper, aluminum, or the like. The interconnecting member 12 may be configured to connect a battery cell group in series with adjacent cell groups included in the battery assembly.

The battery cells 14 are attached to the interconnecting member 12 through a plurality of tabs 20, which may be disposed on the second members of the joints. The first, second, and third cells 15, 16, and 17, include a first tab 21, a second tab 22, and a third tab 23, respectively. Each of the battery cells 14 and tabs 20 may be substantially identical, such that an individual battery cell 14 may be designated as first, second, or third.

Electrical connection between the tabs 20 occurs through a plurality of weld joints 24. The weld joints 24 are composite joints formed from the individual weld nugget joints. Specific weld joints 24 may be referred to as a first weld stack 25, a second weld stack 26, and a third weld stack 27. More or fewer weld joints 24 may be used to electrically connect the tabs 20.

In certain embodiments, battery cell tabs 20 may be electrically connected via one or more welds, solder connections, mechanical connectors, or electrically conductive adhesives. For example, battery cell tabs 20 may be electrically connected via one or more ultrasonic welds, laser welds, ion-beam welds, resistance welds, friction welds, or the like. In other embodiments, battery cell tabs 20 and the associated interconnecting member 12 may be electrically connected via conductive rivets, clips, clamps, or the like.

Figure 3A:
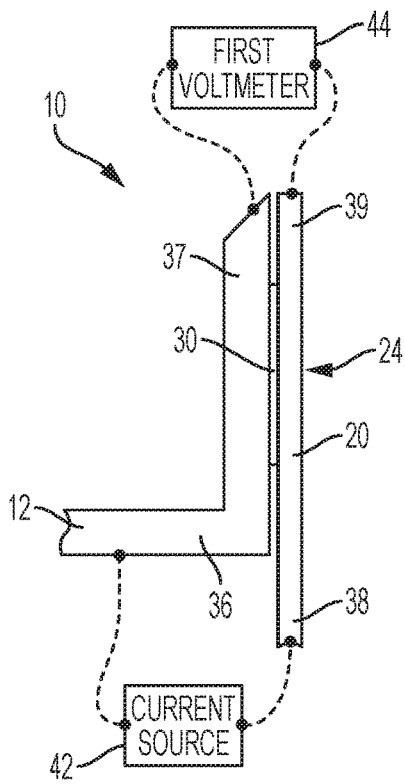
FIG. 3A is a schematic side view of a portion of a battery cell similar to that shown in FIG. 2 having a single-tab configuration.
Figure 3B:
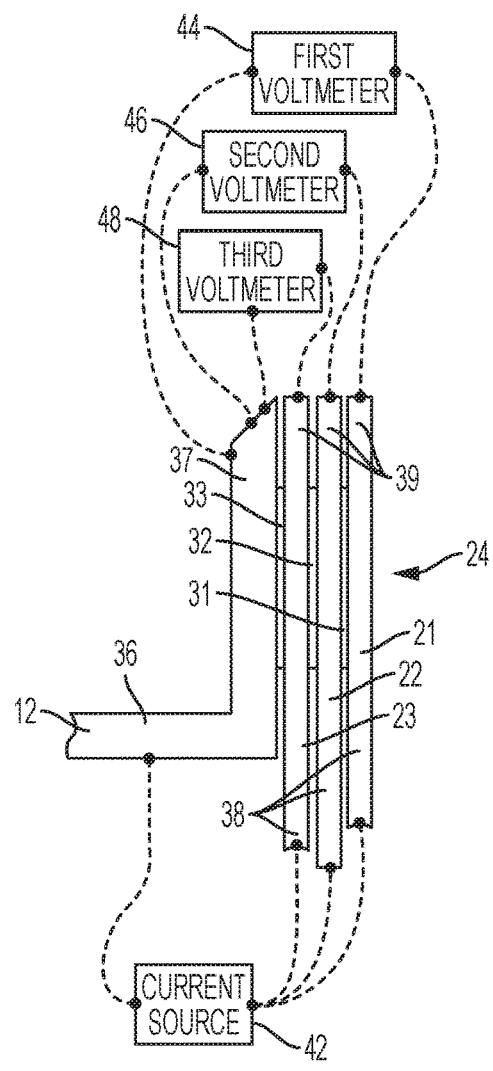
FIG. 3B is a schematic side view of a portion of a battery cell similar to that shown in FIG. 2 having a three-tab configuration.
Figure 4:
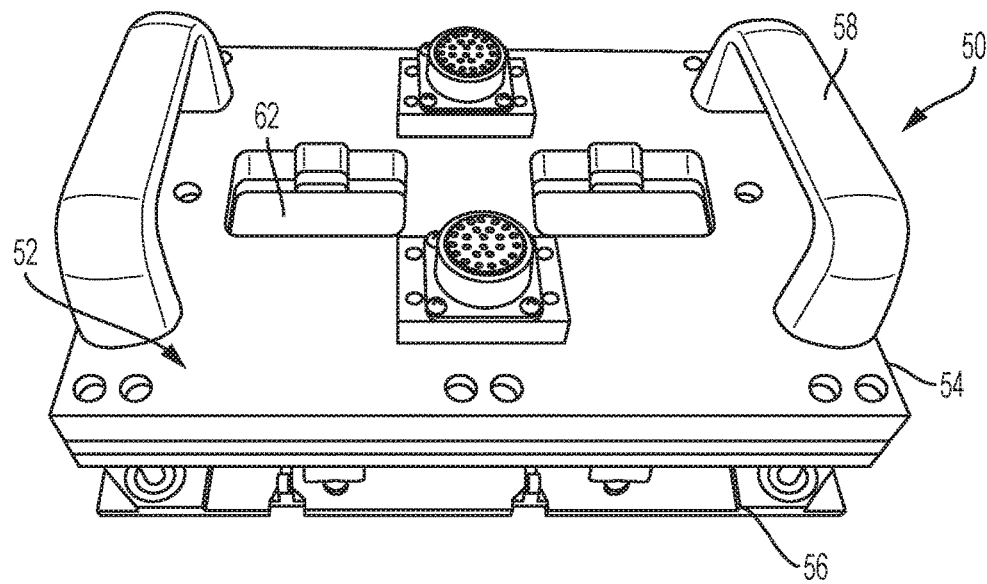
FIG. 4 is a schematic perspective view of a battery testing unit for use with the battery assembly in accordance with embodiments of the disclosure.

Referring now to FIG. 3A and FIG. 3B, and with continued reference to FIG. 2, there are shown two side views of portions of battery modules 10 similar to the portion of the battery module 10 shown in FIG. 2. FIG. 3A shows a side view of a single-tab configuration in which the tab 20 is welded directly to the interconnecting member 12, such that the weld joint 24 includes one weld nugget 30. FIG. 3B shows a side view of a two-tab or three-tab configuration in which the two or three tabs 20 are welded to the interconnecting member 12, such that the weld joint 24 has three weld nuggets 30, a first weld nugget 31, a second weld nugget 32, and a third weld nugget 33. Features and components shown in other Figures may be incorporated and used with those shown in FIGS. 3A and 3B.

Although illustrated as separately-identifiable components, the weld nuggets 30 may generally be considered as zones of coalescence between the adjacent tabs 20. Furthermore, adjacent tabs 20 may be pressed together during assembly, such that a side-view would not necessarily show the individual weld nuggets 30 between the tabs 20. The weld nuggets 30 may be of varying thickness and area and may be formed by resistance welding, ultrasonic welding, or other suitable welding processes. The weld nuggets 30, individually, or the weld joints 24 may also be referred to as joints or weld joints. The weld nuggets 30 may be individually measured or checked for joint integrity or the weld joints 24 may be measured for overall joint integrity.

As shown in FIG. 3A, the L-shaped interconnecting member 12 has a first end 36 and a second end 37, which are disposed on opposing sides of the weld nugget 30. Similarly, the tab 20 has a first end 38 and a second end 39, which are also disposed on opposing sides of the weld nugget 30. The first end 36 of the interconnecting member 12 and the first end 38 of the tab 20 are on the same relative side of the weld nugget 30. The location of the weld nugget 30, or the other joint types, defines the relative location of the first ends 36, 38 and the second ends 37, 39. Therefore, the first ends 36, 38, as viewed in the Figures are below the joint and the second ends 37, 39, as viewed in the Figures, are above the joint.

The battery evaluating or testing system consistent with embodiments disclosed herein may be used in connection with determining a quality of electrical connections between battery cell tabs and/or associated common busses, between interconnecting members, and/or between battery cell sense line in the U-channel and a fused trace line connected to the interconnected board (ICB) connected together via a rivet, fastener or the like as will be described in greater detail below. In some embodiments, the disclosed may further be used in connection with identifying improperly formed, acceptable, and/or unacceptable electrical connections between battery cell tabs and/or associated interconnecting members. In certain embodiments, a quality of a welded battery cell tab electrical connection may be determined based on a supplied current and a measured resistance across the electrical connection. In further embodiments, a quality of a welded battery cell tab electrical connection may be determined based on measuring a voltage drop across a cell group of a multi-cell battery assembly, thereby providing an indication of whether a desired number of battery cells in the cell group are electrically connected via the welded battery cell tab electrical connection.

In one of the embodiments of the disclosure, the battery cell 14 or the tab 20 is connected to a current source 42, which supplies a current to the first end 38 of the tab 20 via wires or conductors, shown as dashed lines such that current moves through the weld nugget 30. The current source 42 may include a voltage source and a precision resistor. Therefore, the current source 42 may also supply a voltage at a controlled resistance to the first end 38 of the tabs 20. A first voltmeter 44 measures a voltage differential at the second end 39 of the tabs 20.

From the current and the measured voltage, it is possible to calculate the resistance of the weld nugget 30. The calculated resistance may be indicative of the quality of the weld connection or nugget 30. For example, if the weld nugget 30 does not include continuous coalescence between the tabs 20 flow of the current from the tabs 20 may be impeded, causing the calculated resistance to increase. Furthermore, if the weld nugget 30 is broken or has significant cracking, the calculated resistance may also increase greatly.

The three-tab configuration shown in FIG. 3B may be the same configuration of the battery module 10 as is shown in FIG. 2. It is also understood that a two-tab configuration may be used for the battery module 10. The weld joint 24 shown in FIG. 3B includes the first weld nugget 31, the second weld nugget 32, and the third weld nugget 33. The weld joint 24 may be one or more of the first weld stack 25, the second weld stack 26, and the third weld stack 27 shown in FIG. 2.

The first tab 21 has a first end 38 and a second end 39, which are disposed on opposing sides of the first weld nugget 31. The first end 36 of the interconnecting member 12 and the first end 38 of the first tab 21 are on the same relative side of the first weld nugget 31. Similarly, the second tab 22 has a first end 38 and a second end 39 disposed on opposing sides of the second weld nugget 32, and the third tab 23 has a first end 38 and a second end 39 disposed on opposing sides of the third weld nugget 33.

The current source 42 is connected to the first ends 38 of the first tab 21, the second tab 22, and the third tab 23. A first current ($I_1$) is supplied by the current source 42 between the first end 36 of the interconnecting member 12 and the first end 38 of the first tab 21. Similarly, a second current ($I2$) is supplied by the current source 42 between the first end 36 of the interconnecting member 12 and the first end 38 of the second tab 22, and a third current ($I3$) is supplied by the current source 42 between the first end 36 of the interconnecting member 12 and the first end 38 of the third tab 23. The first current, the second current, and the third current may be substantially equal, such that each is approximately one-third of a total stack current (I) supplied by the current source 42.

$$I_1 = I_2 = I_3 = I/3$$

The first voltmeter 44 measures a first voltage ($V_1$) between the second end 37 of the interconnecting member 12 and the second end 39 of the first tab 21. A second voltmeter 46 is attached to the second end 37 of the interconnecting member 12 and the second end 39 of the second tab 22, and measures a second voltage ($V_2$) therebetween. A third voltmeter 48 is attached to the second end 37 of the interconnecting member 12 and the second end 39 of the third tab 23, and measures a third voltage ($V_3$) therebetween.

Electrical current in metallic conductors is realized through flow of electrons. Ohm's law states that the current through a conductor between two points is directly proportional to the potential difference across the two points. The coefficient of proportionality is an inverse of the resistance between the two points. The current in metallic conductors usually obeys Ohm's law. Therefore, the ratio of the voltage to current applied to a metallic conductor or set of conductors, caused by this voltage, is constant and may be called the effective resistance of the set of conductors to the voltage or current applied.

From the total stack current and from the measured first, second, and third voltages, the resistance of each of the first, second, and third weld nuggets 31, 32, 33 may be calculated. A first nugget resistance ($R_{12}$) is the resistance of the first weld nugget 31 between the first tab 21 and the second tab 22. A second nugget resistance ($R_{23}$) is the resistance of the second weld nugget 32 between the second tab 22 and the third tab 23. A third nugget resistance ($R_{3b}$) is the resistance of the third weld nugget 33 between the third tab 23 and the interconnecting member 12. The first, second, and third nugget resistances 31, 32, 33 may be determined or calculated as three unknowns in three equations.

$$V_1 = I^*(\tfrac{1}{3}^*R_{12} + \tfrac{2}{3}^*R_{23} + R_{3b})$$

$$V_2 = I^*(\tfrac{2}{3}^*R_{23} + R_{3b})$$

$$V_3 = I^*(R_{3b})$$

The individual resistances of each of the first weld nugget 31, the second weld nugget 32, and the third weld nugget 33 may be compared to weld quality range having a predetermined minimum nugget resistance and a predetermined maximum nugget resistance. The results of the comparison may then be output to a receiver (not shown, which may be, for example and without limitation: a computer logging data, an operator testing the battery module 10 or portions thereof, or an automated testing and sorting process. The specific values of the weld quality range may vary greatly based upon the type of battery module 10, the materials used for the tabs 20, and the type of welding process used to create the weld nuggets 30 and the weld joints 24.

The results of the comparisons may include, for example and without limitation: a measurement error, a failed joint, and an acceptable joint. When the measured joint is a welded joint, the results of the comparisons may include, for example and without limitation: a measurement error, a failed weld, and an acceptable weld. The measurement error result may be output if the calculated first resistance is below the predetermined minimum nugget resistance. While low resistance generally indicates a better-quality weld, it may be assumed that below the predetermined minimum resistance there is a testing error because even welds of the best quality cannot reduce resistance below, for example, the resistance of the solid materials used.

The failed weld result may be output if the calculated first resistance is above the predetermined maximum nugget resistance, indicating that the weld quality is low and current is having difficulty flowing through the weld joint 24. The acceptable weld result may be output if the calculated first resistance is above the predetermined minimum nugget resistance and below the predetermined maximum nugget resistance such that the resistance falls within the weld quality range.

Comparison of the individual resistances may identify quality compliance issues in manufacturing or assembly of the battery module 10. For example, and without limitation, after several tests and comparisons, it may be determined that the third weld nugget 33 is often not fully-formed, and the welding process may be adjusted accordingly.

In addition to solving the three equations for the resistance of each of the individual nuggets, the parenthetical quantities may be determined as resistance constants for portions of the weld joint 24. A first weld stack resistance (R1) is the total resistance of the weld joint 24, and may be indicative of the total quality of the weld joint 24 as a whole. The resistance constant for the weld joint 24 is not the resistance of a specific element, but is the total effective resistance between the first tab 21 and the interconnecting member 12.

$$V_1 = I^*(R_1)$$

A weld quality range may also be applied to the resistance constant for the whole weld joint 24, such that the first weld stack resistance is compared to a predetermined minimum stack resistance and a predetermined maximum stack resistance. The individual resistances of the first, second, and third weld nuggets 31, 32, 33 may help identify specific manufacturing flaws. The resistance constant for the whole weld joint 24, however, may help identify successful assembly of that portion of the battery module 10 for quality control. It may be that each of the weld joints 24 needs to function for the battery module 10 to clear inspection. In such a case, it may be irrelevant which of the weld nuggets 30 within the weld joint 24 has defaults.

The weld joint 24 may be the first weld stack 25 shown in FIG. 2. Similarly, referring to FIG. 2, each of the first weld stack 25, the second weld stack 26, and the third weld stack 27 may have the total current supplied between the first end 38 of the first tab 21 and the first end 36 of the interconnecting member 12. One voltmeter may be connected above each of the first through third weld stacks 25-27, similar to the first voltmeter 44 shown in FIG. 3B, to the second end 39 of the first tab 21 and the second end 37 of the interconnecting member 12.

From the total current supplied below each of the first through third weld stacks 25-27 and from the voltage measured above each of the first through third weld stacks 25-27, the resistance constant may be determined for each of the first through third weld stacks 25-27. Furthermore, the resistance constants of each of the first through third weld stacks 25-27 may be compared to the weld quality range to determine whether the total stack weld quality is within the predetermined range. Because the first through third weld stacks 25-27 represent easier paths for current flow than directly between the un-welded portions of the tabs 20, the tabs 20 may be treated as if they are electrically separate, or have air gaps, between the first through third weld stacks 25-27 when determining the resistance thereof.

Referring now to FIGS. 4-10, a battery testing unit, generally referenced by numeral 50 for use with the battery testing system of the disclosure is illustrated and described. FIGS. 4-7 illustrate the battery testing unit 50 having a housing 52 with an upper surface 54 and an opposing lower surface 56. One or more handles 58 may be disposed on the upper surface 54 of housing 52 to allow for manual or automated placement of the battery testing unit 50 adjacent the battery unit 60. The battery testing unit 50 may be engaged and positioned by human interaction or through the use of a controlled or automated machine.

Figure 6:
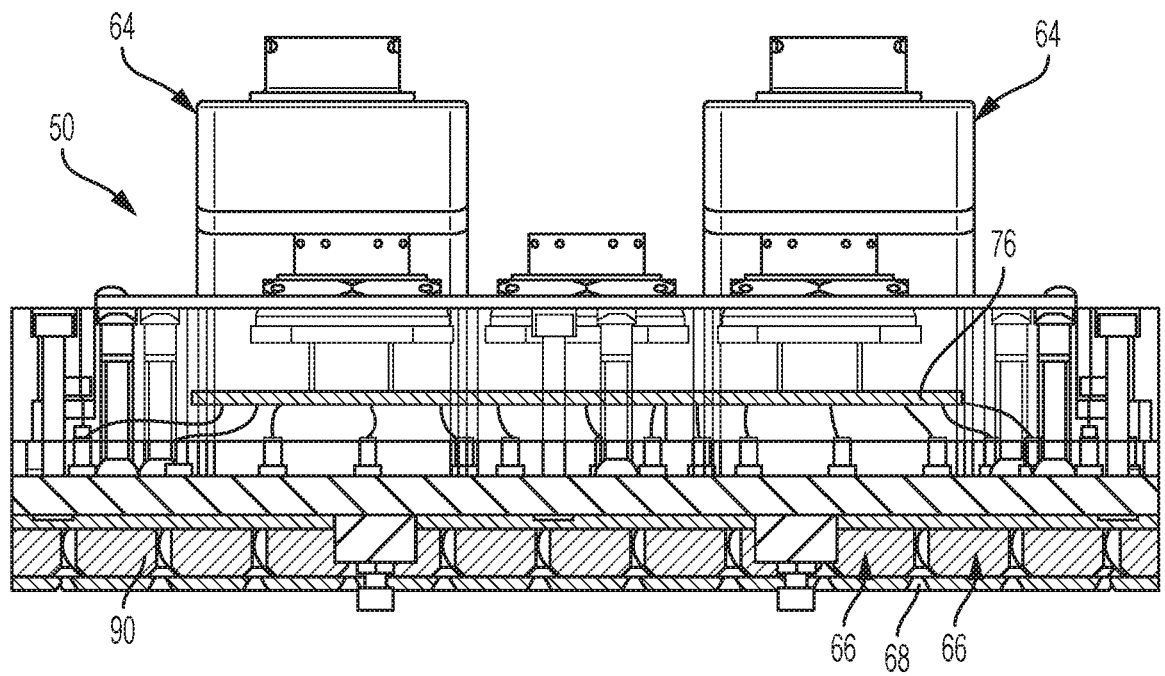
FIG. 6 is a schematic side sectional view of the battery testing unit in accordance with the disclosure.
Figure 7:
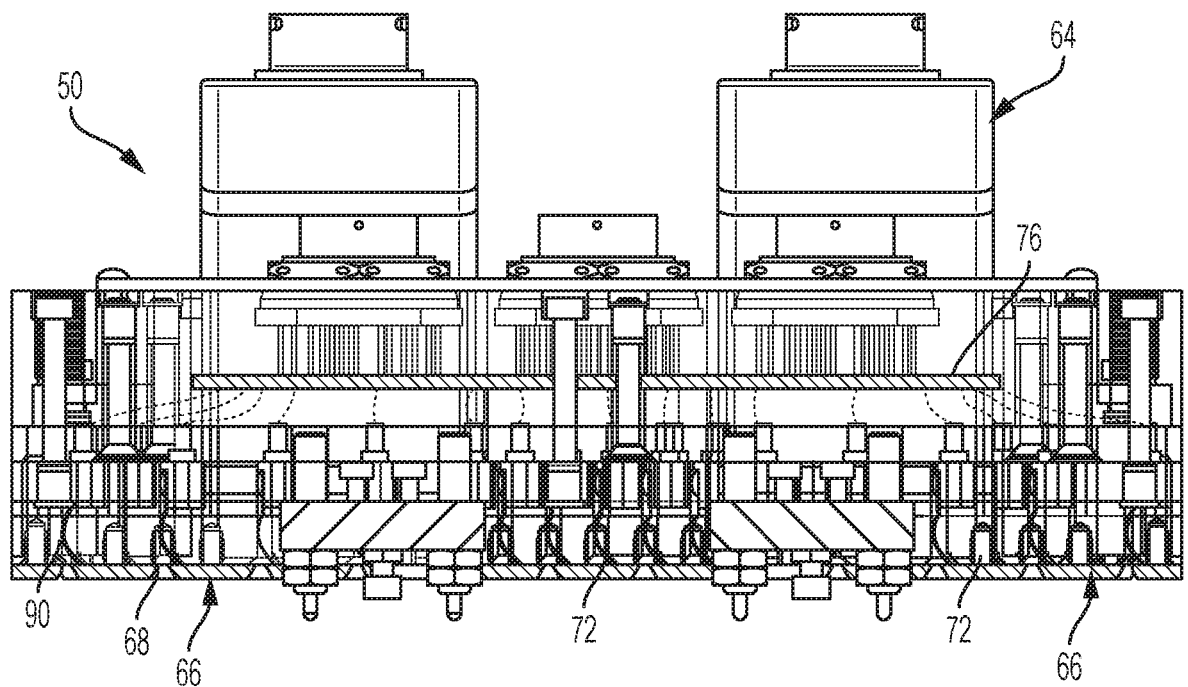
FIG. 7 is another schematic side sectional view of the battery testing unit.

The housing 52 further includes one or more apertures 62 extending at least partially through the housing 52 to removably secure at least one external connector 64 therein. The at least one external connector 64, as is best shown in FIGS. 6 and 7, extends through the aperture 62 in housing 52 to provide a resistance connection point for at least one or both of the tab and/or associated interconnecting member of a battery module of the battery assembly. The at least one external connector 64 includes one or more leads or connections that electrically communicate with the plurality of testing modules 66 to reduce complexity of the battery testing unit 50. It is contemplated that the at least one external connector 64 may be used in the battery testing unit housing 52 or may be manually applied through the battery testing unit 50 to accomplish the objectives of the disclosure.

Figure 5:
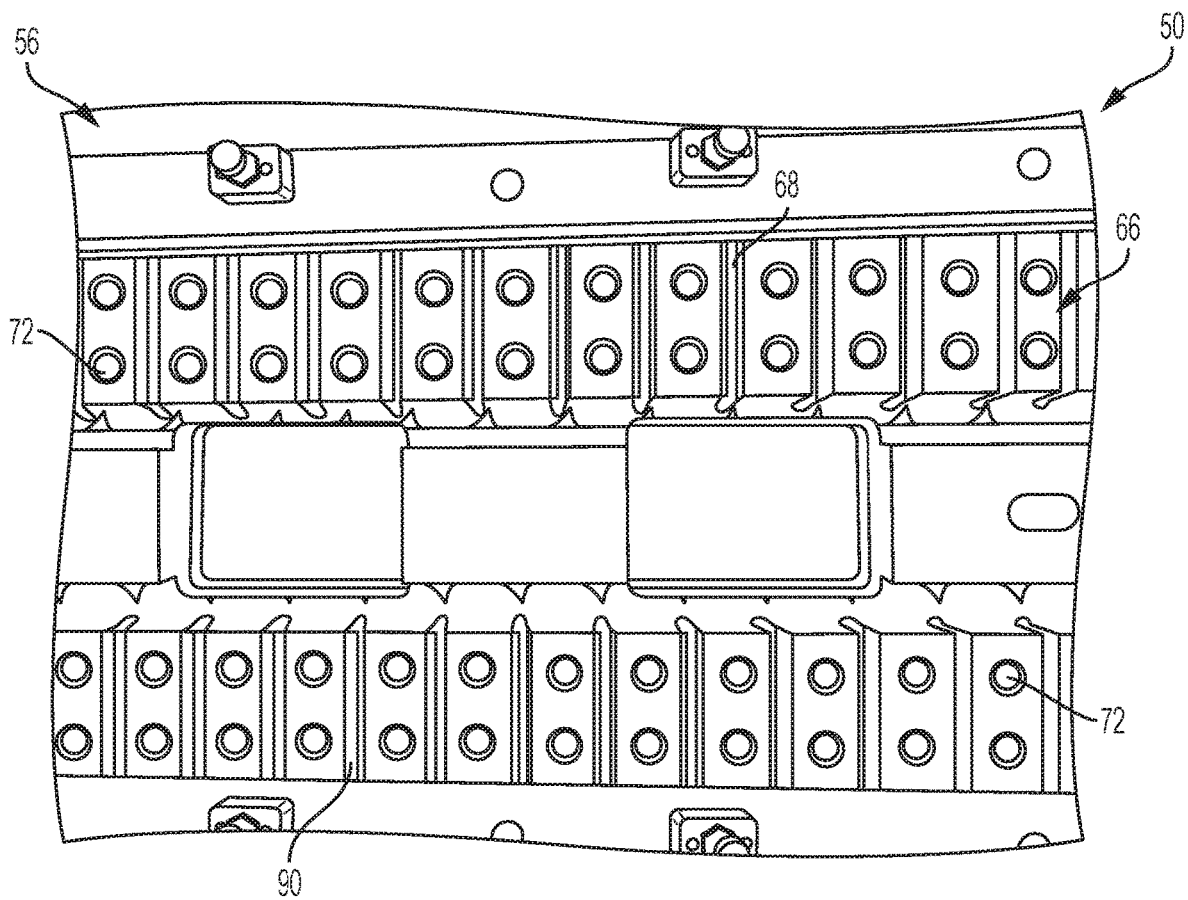
FIG. 5 is a schematic perspective view of a portion of a lower surface of the battery testing unit housing of the battery testing unit.

Referring now to FIGS. 5-7, a plurality of testing modules 66 are configured to communicate with and electrically contact opposing sides of tabs of the battery tabs and associated interconnecting member (ICB) of the battery module. Testing modules 66 may be positioned in a variety of locations and alignments to correspond with the configuration of the battery packs of the battery module in the battery assembly. The plurality of testing modules 66 each include a body that is disposed adjacent a lower surface 56 of the housing 52 and are spaced apart from the bodies of adjacent testing modules 66. In one embodiment of the disclosure, the body of testing module 66 includes a lower surface receiving at least one element 72 and one or more side surfaces extending from the lower surface to receive and support at least one contact 90 thereon as will be described in greater detail below. The bodies of adjacent testing modules 66 define a slot or channel 68 therebetween.

It is contemplated that channel 68 may be sized to receive the welded combination of the interconnecting member and tabs of a battery pack therein and bring the member and tabs in communication with at least one contact 90. Further, the positioning of the plurality of testing modules 66 and corresponding channels 68 may allow closer tab to tab spacing of the battery packs, thereby allowing for increased battery unit energy density. The leads or connections of the at least one external connector 64 electrically communicate with the plurality of testing modules 66 to create a first end of a testing circuit for the battery testing unit 50 when the modules 66 engage the battery unit.

Figure 10:
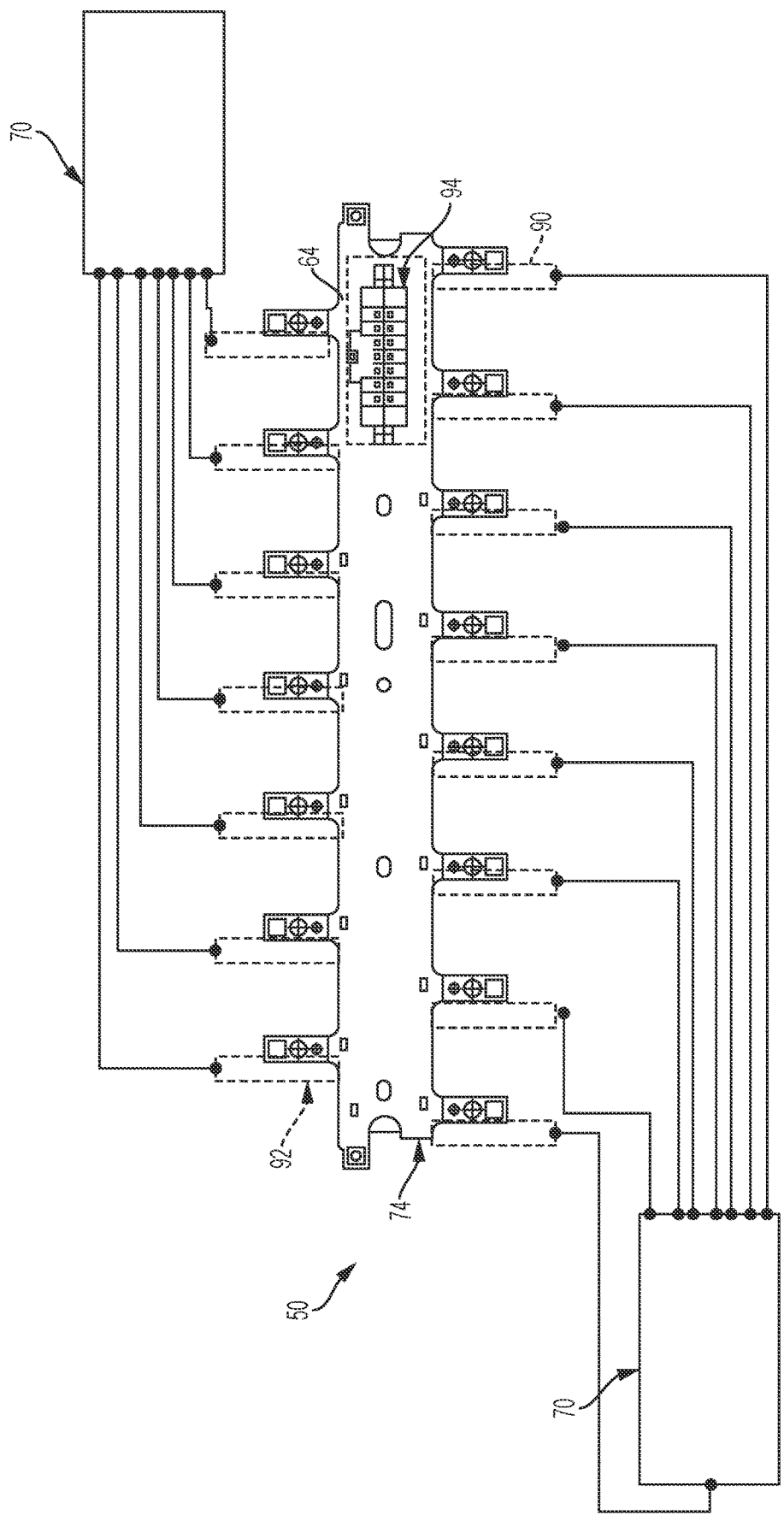
FIG. 10 is a schematic view of a battery connection quality system for use in accordance with the embodiments of the disclosure.

The plurality of testing modules 66 may be in communication with a controller 70 through the at least one external connector 64. Controller 70, as shown in FIG. 10, is configured to, at least in part, control the operation of the battery testing unit 50 and/or perform one or more determinations of electrical connection quality in the battery unit 60 consistent with embodiments disclosed herein. Among other things, the controller 70 may include one or more voltmeters and/or current sources configured to be used in connection with determining electrical connection quality consistent with embodiments disclosed herein.

Figure 8:
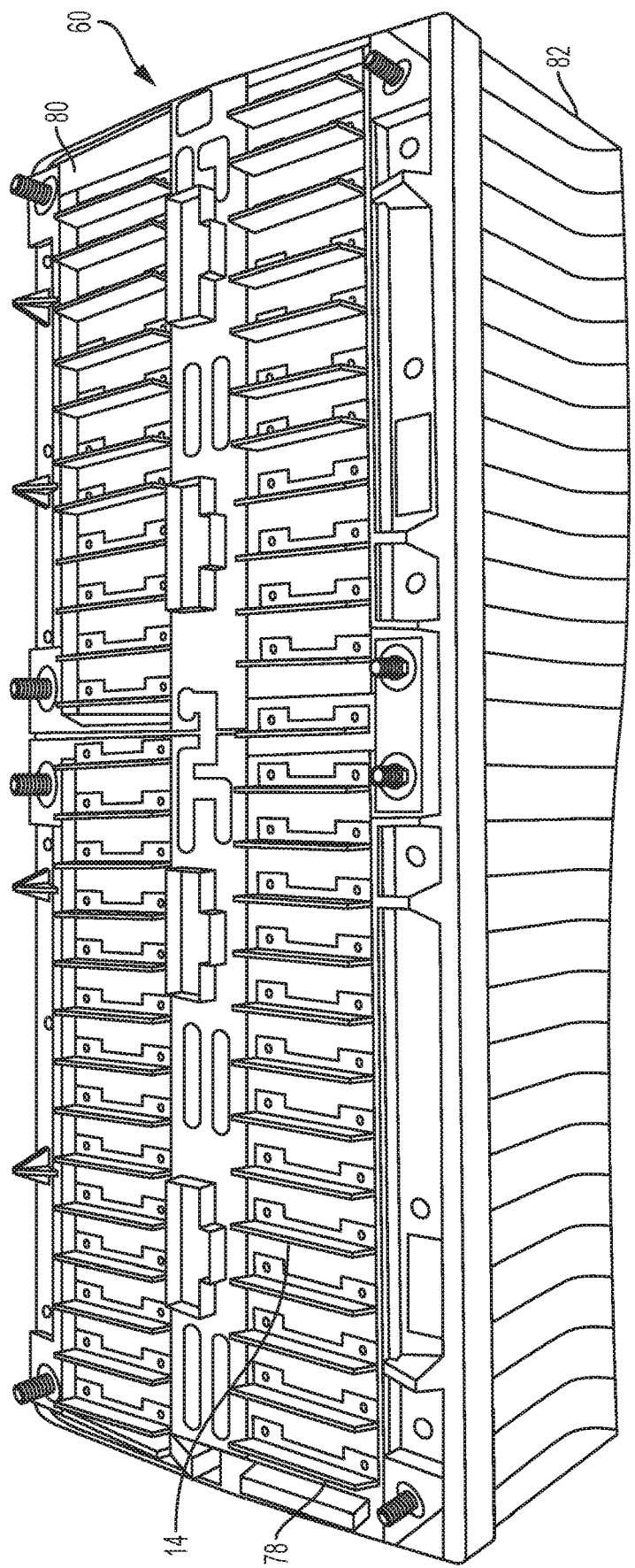
FIG. 8 is a schematic perspective view of a battery unit of the battery assembly.

At least one pin or element 72 is provided on and extends from one or more of the plurality of modules 66. As illustrated in FIG. 5, the at least one element 72 extends downward from the lower surface 56 of the housing 52 and may be configured to engage a portion of the ICB 74 of the battery module as best shown in FIG. 10 and in FIG. 1 as interconnecting board 108 of battery module 101. The at least one element 72 is in electrical communication with the controller 70 through the at least one external connector 64 and may be configured to electrically contact opposing sides of tabs 20 during testing and/or measurement operations when the testing unit 50 is placed adjacent battery unit 60 as illustrated in FIG. 8. It is contemplated that an interface 76 may be provided in the housing 52 of the battery testing unit 50 that allows the at least one external connector 64 to communicate with the at least one element 72. Interface 76 may also be in electrical communication with the one or more contacts 90.

In one embodiment of the disclosure, the at least one element 72 of the battery testing unit 50 may be a spring loaded projection, pin or "pogo-pin" such that, when element 72 is pressed between the module 66 and ICB 74, points at each end of the element are in contact with and electrically connect the testing module 66 and ICB 74. It is contemplated that use of the spring loaded elements 72 may reduce the number of wiring connection points in the testing unit 50, thereby reducing complexity of maintenance of the testing unit 50. Further, use of spring loaded elements 72 may improve testing results of the battery testing unit 50 by reducing false test failures and potential damage to the tabs during testing.

Additionally, when the battery testing unit 50 is positioned on battery unit 60, the at least one element 72 engages a portion of the ICB 74, thereby closing element 72 so as to make electrical contact between the module 66 and ICB 74. Alternatively, the at least one element 72 engages a portion of a fastener or rivet that interconnects the battery cell sense line in the U-channel 68 and a trace line connected to the ICB 74 to evaluate the quality of the rivet or fastener connection. The interconnection of the module 66 and ICB 74 is represented by box 94. Controller 70 in communication with element 72 and contacts 90 may simultaneously evaluate voltage and resistance measurements.

A non-limiting exemplary embodiment of the battery unit 60 is illustrated in FIG. 8. Battery unit 60 may include one or more battery packs or sections 78, 80 and may include integrally formed fluid cooling passages 82 each extending along the length of the battery unit 60 and located on opposite lateral sides of the battery cells 14. The fluid cooling passages 82 of each battery section 78, 80 are connected to the corresponding passages of an adjacent battery section 78, 80 or to another portion of a cooling circuit by hoses and tubes.

Each battery pack or section 78, 80 may include multiple voltage temperature sub-modules (VTSM) stacked along a length of the battery section, each VTSM having a battery cell 14, replacement frame, jacket and foam. Each VTSM has a positive tab and a negative tab and the tabs of adjacent VTSMs are welded together. Preferably, the cells 14 contain the battery electrolyte, lithium ions, in the form of a gel.

Figure 9:
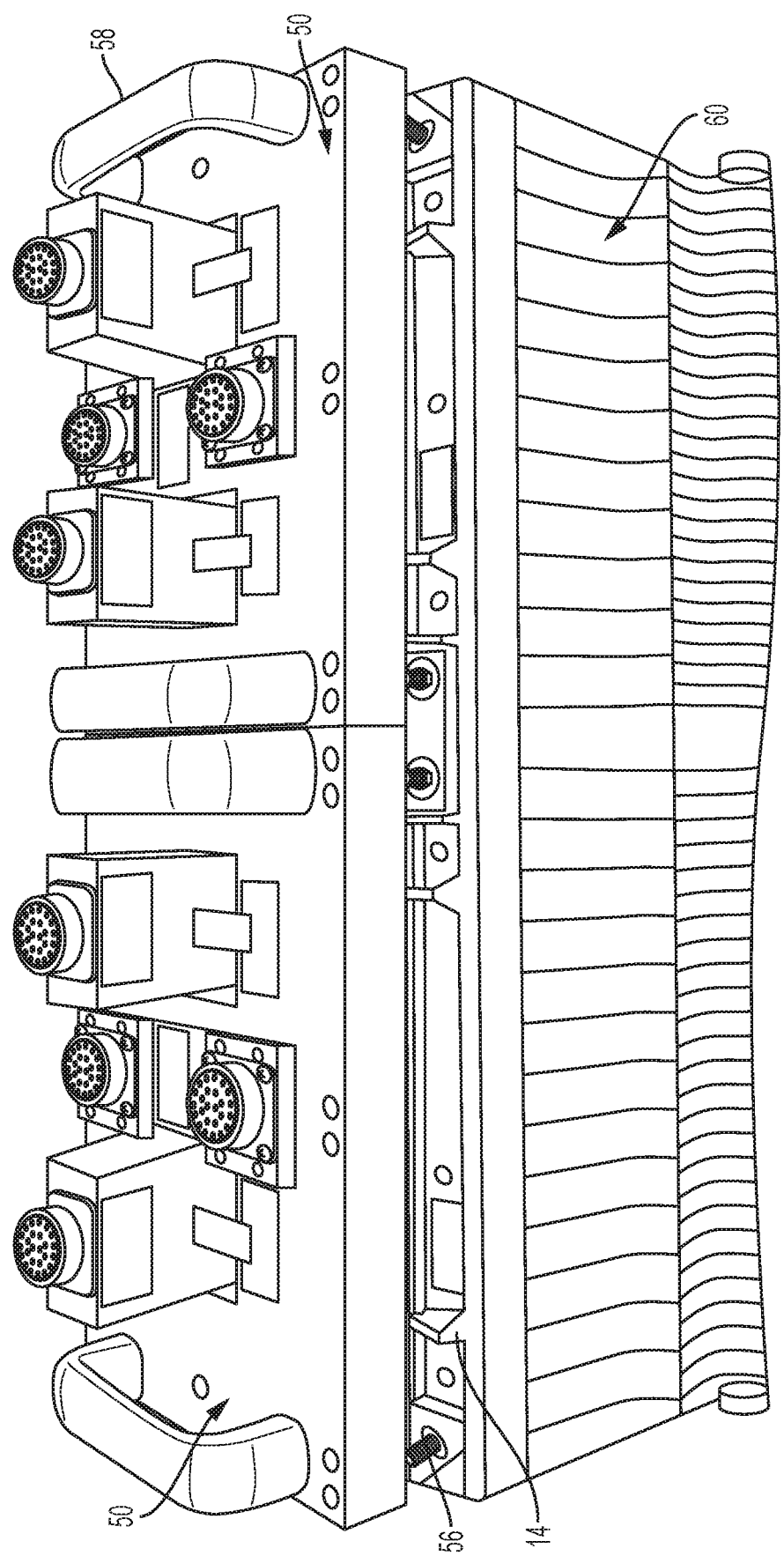
FIG. 9 is a schematic perspective view of the battery testing unit disposed adjacent the battery unit for evaluating battery connection quality.

As is shown in FIG. 9, one or more battery testing units 50 are sized to cooperate with an upper portion of the battery unit 60. Battery testing units 50 cooperate with the battery cell sections with welded interconnecting members and battery cells received within the plurality of channels in the lower surface of the battery channel housing 52. The one or more handles 58 on the upper surface of the housing 52 are used to adjustably position the testing unit 50 in position on the battery unit 60 to ensure an appropriate connection to test the battery sections.

Referring now to FIGS. 6, 7 and 10, one or more contacts 90 are provided on at least one surface of the plurality of testing modules 66. In one embodiment of the disclosure, at least one contact 90 is provided adjacent one of the surfaces of the channel 68 formed between two of the plurality of testing modules 66. The at least one contact 90 is in electrical communication with the controller 70 through interface 76 disposed in the battery testing unit housing 52. The at least one contact 90 provides contact points for supplying an electrical current across the tabs for the interconnecting member and battery cells.

As shown in the sectional view in FIG. 7, the at least one contact 90 may be shaped to be biased against the tab to ensure electrical contact for testing purposes. The one or more contacts 90 electrically communicate with the battery tabs and/or associated interconnecting member of the battery module of the battery unit 60 to create a second end of a testing circuit for the battery testing unit 50 that cooperates with the first end of the testing circuit provided by the plurality of testing modules 66.

In further embodiments, the contacts 90 may be configured to provide contact points for measuring one more voltages across the tabs for the interconnecting member and battery cells to electrically contact one or more sides of the tabs and/or the associated interconnecting member 12 as represented by boxes 92. Additionally, when the battery testing unit 50 is positioned on battery unit 60, the at least one element 72 engages a portion of the ICB 74, thereby closing element 72 so as to make electrical contact between the module 66 and ICB. The interconnection of the module 66 and ICB 74 is represented by box 94. Controller 70 in communication with element 72 and contacts 90 may simultaneously evaluate voltage and resistance measurements.

Figure 11:
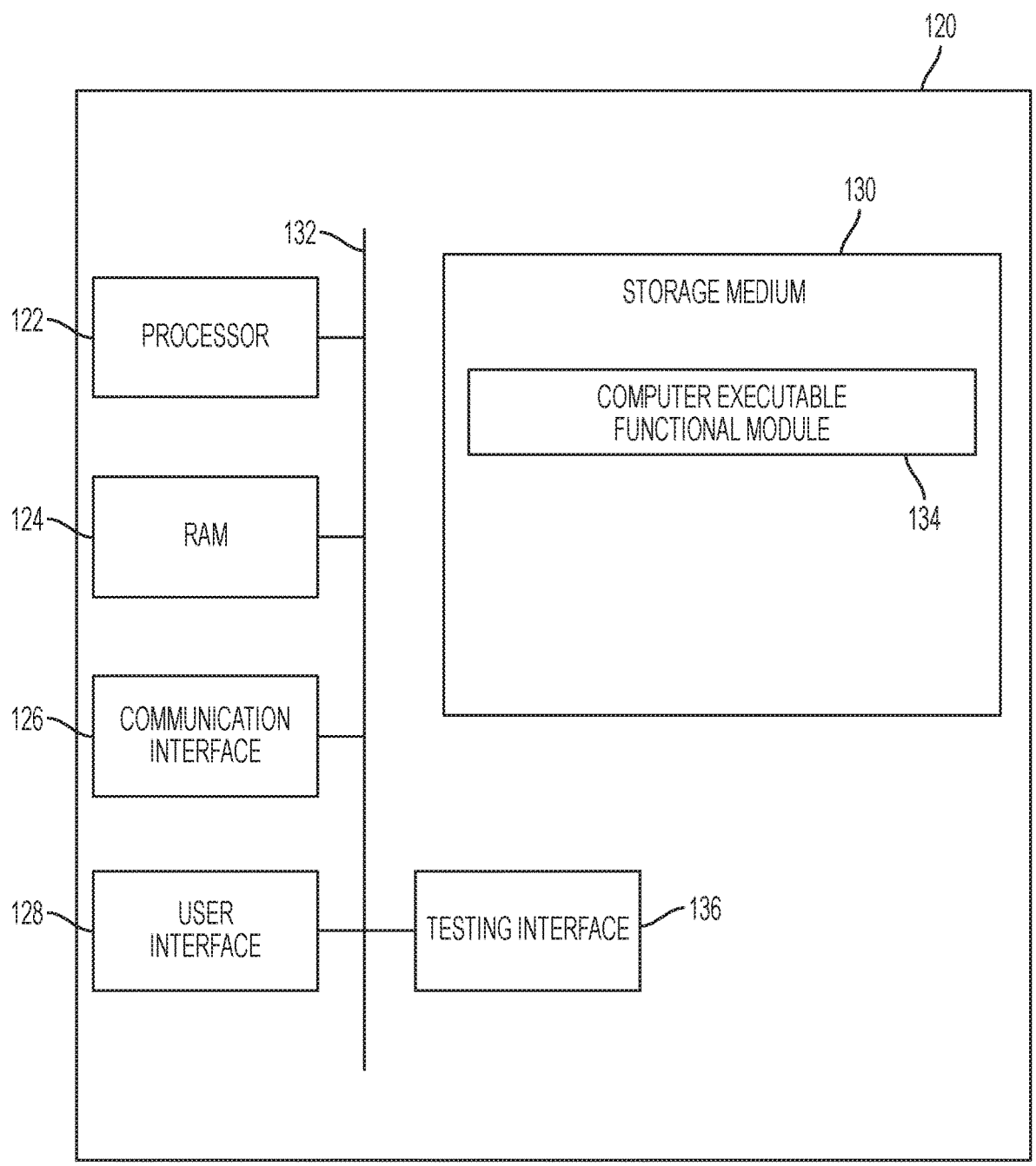
FIG. 11 is a schematic view of an exemplary system for implementing the system for evaluating battery connection quality in accordance with the embodiments of the disclosure.

FIG. 11 illustrates an exemplary system 120 for implementing certain embodiments of the systems and methods disclosed herein. In certain embodiments, the computer system 120 may be a personal computer system, a server computer system, a testing control system, and/or other type of system for implementing the disclosed systems and methods. In further embodiments, the computer system 120 may be a portable electronic computer system or electronic device including, for example, a notebook computer, a smartphone, and/or a tablet computer.

As illustrated, the computer system 120 may include, among other things, one or more processors 122, random access memory ("RAM") 124, a communications interface 126, a user interface 128, a measurement and/or testing interface 136 configured to supply one or more electrical currents and/or measure one or more voltages, and a non-transitory computer-readable storage medium 130. The processor 122, RAM 124, communications interface 126, user interface 128, measurement and/or testing interface 136, and computer-readable storage medium 130 may be communicatively coupled to each other via a common data bus 132. In some embodiments, the various components of the computer system 120 may be implemented using hardware, software, firmware, and/or a combination thereof.

User interface 128 may include a number of devices allowing a user to interact with the computer system 120. For example, user interface 128 may be used to display an interactive interface to a user. The user interface 128 may be a separate interface system communicatively coupled with the computer system 120 or, alternatively, may be an integrated system such as a display interface for a laptop or other similar device. In certain embodiments, the user interface 128 may be produced on a touch screen display. The user interface 128 may also include a number of other input devices including, for example, keyboard, trackball, and/or pointer devices.

The communications interface 126 may be an interface capable of communicating with other computer systems, peripheral devices, and/or other equipment communicatively coupled to computer system 120. For example, the communications interface 126 may allow the computer system 120 to communicate with other computer systems (e.g., computer systems associated with external databases and/or the Internet), allowing for the transfer as well as reception of data from such systems. The communications interface 126 may include, among other things, a modem, a satellite data transmission system, an Ethernet card, and/or other device that enables the computer system 120 to connect to databases and networks, such as LANs, MANs, WANs and the Internet.

Processor 122 may include one or more general purpose processors, application specific processors, programmable microprocessors, microcontrollers, digital signal processors, FPGAs, other customizable or programmable processing devices, and/or other devices or arrangement of devices that are capable of implementing the systems and methods disclosed herein.

Processor 122 may be configured to execute computer-readable instructions stored on non-transitory computer-readable storage medium 130. Computer-readable storage medium 130 may store other data or information as desired. In some embodiments, the computer-readable instructions may include computer executable functional modules 134. For example, the computer-readable instructions may include one or more functional modules configured to implement the functionality of the systems and methods described above. Specific functional models that may be stored on computer-readable storage medium 130 may include a module configured to control a current source, a module configured to measure one or more voltages, a module configured to determine one or more measured resistances, a module configured to perform electrical connection quality determinations consistent with embodiments disclosed herein, and/or other module or modules configured to implement the systems and methods disclosed herein.

The system and methods described herein may be implemented independent of the programming language used to create the computer-readable instructions and/or an operating system operating on the computer system 120. For example, the computer-readable instructions may be written in a programming language, examples of which include, but are not limited to, C, C++, Visual C++, and/or Visual Basic, Java, Perl, or another programming language. Further, the computer-readable instructions and/or functional modules may be in the form of a collection of separate programs or modules, and/or a program module within a larger program or a portion of a program module. The processing of data by computer system 120 may be in response to user commands, results of previous processing, or a request made by another processing machine. It will be appreciated that computer system 120 may utilize an operating system including, for example, Unix, DOS, Android, Symbian, Windows, iOS, OSX, Linux, and/or the like.

The foregoing specification has been described with reference to various embodiments. Various operational steps, as well as components for carrying out operational steps, may be implemented in alternate ways depending upon the particular application or in consideration of a number of cost functions associated with the operation of the system. For example, one or more of the steps may be deleted, modified, or combined with other steps. Further, this disclosure is to be regarded in an illustrative rather than a restrictive sense, and the modifications are intended to be included within the scope thereof.

As used herein, the terms "comprises" and "includes," and other variations thereof, are intended to cover a non-exclusive inclusion, such that a process, a method, an article, or an apparatus that comprises a list of elements includes those elements and may include other elements not expressly listed or inherent to such process, method, system, article, or apparatus. Also, as used herein, the terms "coupled," "coupling," and other variations thereof are intended to cover a physical connection, an electrical connection, a magnetic connection, an optical connection, a communicative connection, a functional connection, and/or other connection.

The detailed description and the drawings or figures are supportive and descriptive of the disclosure, but the scope of the disclosure is defined solely by the claims. While some of the best modes and other embodiments for carrying out the claimed disclosure have been described in detail, various alternative designs and embodiments exist for practicing the disclosure defined in the appended claims. Furthermore, the embodiments shown in the drawings or the characteristics of various embodiments mentioned in the present description are not necessarily to be understood as embodiments independent of each other. Rather, it is possible that each of the characteristics described in one of the examples of an embodiment may be combined with one or a plurality of other desired characteristics from other embodiments, resulting in other embodiments not described in words or by reference to the drawings. Accordingly, such other embodiments fall within the framework of the scope of the appended claims.

The invention claimed is:

1. A system for evaluating battery connection quality in one or more battery modules of a battery assembly comprising:
   a battery testing unit having a housing including an upper surface and a lower surface;
   a plurality of testing modules disposed on the lower surface of the housing to communicate with and electrically contact the one or more battery modules, wherein each of the plurality of testing modules includes a body having a lower surface receiving and supporting at least one element and one or more side surfaces extending from the lower surface to receive and support at least one contact;
   at least one external connector cooperating with the battery testing unit housing and in electrical communication with the at least one element and at least one contact of each of the plurality of testing modules; and
   a controller in electrical communication with the at least one external connector to perform one or more determinations of electrical connection quality of the one or more battery modules,
   wherein the controller is in communication with the at least one element and at least one contact to simultaneously evaluate voltage and resistance measurements of the one or more battery modules.

2. The system of claim 1 further comprising an interface at least partially received within the battery testing housing in electrical communication with the at least one element and the at least one contact.

3. The system of claim 1 wherein the battery testing housing further comprises one or more apertures extending through and between the upper and lower surfaces of the battery testing housing sized to at least partially receive the at least one external connector.

4. The system of claim 3 wherein the interface is in communication with the at least one external connector when the at least one external connector is at least partially received within the battery testing housing.

5. The system of claim 1 wherein the at least one element further comprises at least one spring loaded pin extending from the lower surface of the body of each of the plurality of testing modules to releasably engage and electrically connect the battery testing unit with an interconnecting board of the one or more battery modules.

6. The system of claim 1 wherein at least one channel is formed between opposing side surfaces of opposing bodies of the plurality of testing modules and sized to receive the at least one contact to releasably engage and electrically connect a tab and the interconnecting member of the one or more battery modules.

7. The system of claim 6 wherein the at least one element extends from the lower surface of the body of each of the plurality of testing modules to releasably engage a fastener interconnecting a battery cell sense line in the at least one channel and a trace line of the interconnecting board.

8. The system of claim 1 wherein the controller further comprises one or more voltmeters and one or more current sources configured to be used in connection with determining electrical connection quality of the one or more battery modules.

9. A system for evaluating battery connection quality in one or more battery modules of a battery assembly comprising:
a battery testing unit having a housing including an upper surface and a lower surface;
a plurality of testing modules disposed on the lower surface of the housing to communicate with and electrically contact the one or more battery modules, wherein each of the plurality of testing modules includes a body having a lower surface receiving and supporting at least one element and one or more side surfaces extending from the lower surface to receive and support at least one contact;
an interface at least partially received within the battery testing housing in electrical communication with the at least one element and the at least one contact;
at least one external connector cooperating with the battery testing unit housing and in electrical communication with the interface when the at least one external connector is at least partially received within the battery testing housing; and
a controller in electrical communication with the at least one external connector to perform one or more determinations of electrical connection quality of the one or more battery modules,
wherein the controller is in communication with the at least one element and at least one contact to simultaneously evaluate voltage and resistance measurements of the one or more battery modules.

10. The system of claim 9 wherein the battery testing housing further comprises one or more apertures extending through and between the upper and lower surfaces of the battery testing housing sized to at least partially receive the at least one external connector.

11. The system of claim 10 wherein the interface is in communication with the at least one external connector when the at least one external connector is at least partially received within the battery testing housing.

12. The system of claim 9 wherein the at least one element further comprises at least one spring loaded pin extending from the lower surface of the body of each of the plurality of testing modules to releasably engage and electrically connect the battery testing unit with an interconnecting board of the one or more battery modules.

13. The system of claim 9 wherein at least one channel is formed between opposing side surfaces of opposing bodies of the plurality of testing modules and sized to receive the at least one contact to releasably engage and electrically connect a tab and the interconnecting member of the one or more battery modules.

14. The system of claim 13 wherein the at least one element extends from the lower surface of the body of each of the plurality of testing modules to releasably engage a fastener interconnecting a battery cell sense line in the at least one channel and a trace line of the interconnecting board.

15. The system of claim 9 wherein the controller further comprises one or more voltmeters and one or more current sources configured to be used in connection with determining electrical connection quality of the one or more battery modules.

16. A testing unit for evaluating battery connection quality in one or more battery modules of a battery assembly comprising:
a housing including an upper surface, a lower surface and one or more apertures extending through the housing between the upper and lower surfaces;
a plurality of testing modules disposed on the lower surface of the housing to communicate with and electrically contact the one or more battery modules, wherein each of the plurality of testing modules includes a body having a lower surface receiving and supporting at least one element and one or more side surfaces extending from the lower surface to receive and support at least one contact;
an interface at least partially received within the battery testing housing in electrical communication with the at least one element and the at least one contact; and
at least one external connector cooperating with the battery testing unit housing and in electrical communication with the interface when the at least one external connector is at least partially received within the battery testing housing,
wherein the at least one external connector performs one or more determinations of electrical connection quality through the at least one element and at least one contact to simultaneously evaluate voltage and resistance measurements of the one or more battery modules.

17. The testing unit of claim 16 wherein the interface is in communication with the at least one external connector when the at least one external connector is at least partially received within the battery testing housing.

18. The testing unit of claim 16 wherein the at least one element further comprises at least one spring loaded pin extending from the lower surface of the body of each of the plurality of testing modules to releasably engage and electrically connect the battery testing unit with an interconnecting board of the one or more battery modules.

19. The testing unit of claim 16 wherein at least one channel is formed between opposing side surfaces of opposing bodies of the plurality of testing modules and sized to receive the at least one contact to releasably engage and electrically connect a tab and the interconnecting member of the one or more battery modules.

20. The testing unit of claim 19 wherein the at least one element extends from the lower surface of the body of each of the plurality of testing modules to releasably engage a fastener interconnecting a battery cell sense line in the at least one channel and a trace line of the interconnecting board.

* * * * *